United States Patent [19]

Murakami et al.

[11] 4,239,813

[45] Dec. 16, 1980

[54] PROCESS FOR FORMING PRINTED WIRING BY ELECTROLESS DEPOSITION

[75] Inventors: Kanji Murakami; Mineo Kawamoto; Yoichi Matsuda; Motoyo Wajima; Hirosada Morishita, all of Hitachi, Japan

[73] Assignee: Hitachi, Ltd., Japan

[21] Appl. No.: 33,218

[22] Filed: Apr. 25, 1979

[30] Foreign Application Priority Data

Apr. 25, 1978 [JP] Japan .................................. 53/48331

[51] Int. Cl.³ ........................... C23C 3/02; H01B 5/14
[52] U.S. Cl. ..................................... 427/98; 156/668; 427/304; 427/305; 427/306; 427/307; 430/319
[58] Field of Search ............ 427/98, 53, 307, 304–306; 156/668; 96/36.2; 430/319

[56] References Cited

U.S. PATENT DOCUMENTS

| | | |
|---|---|---|
| 3,562,038 | 2/1971 | Shipley et al. |
| 3,619,285 | 11/1971 | Feldstein .............................. 427/306 |
| 4,054,479 | 10/1977 | Peiffer ................................... 427/98 |
| 4,086,128 | 4/1978 | Sugio et al. ............................ 427/98 |
| 4,112,139 | 9/1978 | Shirk et al. ............................. 427/98 |
| 4,151,313 | 4/1979 | Wajima et al. .......................... 427/98 |

OTHER PUBLICATIONS

Feldstein, "Selective Electroless Plating Techniques: A Survey", Plating, Aug., 1970.

Tabei, et al., "Method for Forming a Printed Circuit by Photolysis of Silver Salt of Organic Acid", J. Electrochem. Soc., vol. 121, No. 1, pp. 67–69 (1974).

*Primary Examiner*—John D. Smith
*Attorney, Agent, or Firm*—Craig and Antonelli

[57] ABSTRACT

Highly precise wiring formed on an insulating substrate can be obtained by electroless deposition without using a printing process. Said process is characterized by forming an adhesive layer containing a photo-setting substance on a substrate, exposing the adhesive layer to actinic light imagewisely so as to irradiate only portions other than those forming wiring, treating the surface of the substrate with a roughening solution so as to roughen the portions not exposed to actinic light, and subjecting to the conventional treatments for electroless deposition so as to form prescribed wiring on the portions not exposed to actinic light.

8 Claims, No Drawings

PROCESS FOR FORMING PRINTED WIRING BY ELECTROLESS DEPOSITION

BACKGROUND OF THE INVENTION

This invention relates to a process for forming printed wiring, more particularly to a process for forming printed wiring on an insulating substrate for producing easily printed wiring boards without including a printing procedure, e.g. for masking, but using an electroless deposition procedure.

Heretofore, there have been proposed various processes for forming printed wiring on insulating substrates for producing printed wiring boards by using electroless deposition procedures. But many of these processes inevitably employ printing procedures therein. For example, U.S. Pat. Nos. 3,619,285 and 3,562,038 propose processes for the deposition of electroless metal on selected areas of a substrate for forming circuits which involve printing a substance which makes the surface easily roughened on the preserbed circuit forming portions or, to the contrary, printing a substance which protects the surface from roughening on portions other than the circuit forming portions in order to make difference in coarseness between the circuit forming portions and the portions other than the circuit forming portions, immersing the thus treated substrate in a catalyst solution, selectively removing the catalyst on the portions other than the circuit forming portions the surface of which are not so roughened with an acid or an oxidizing agent, and effecting electroless deposition. According to these processes, only the circuit forming portions are roughened. For example, an undercoat resin layer (or an adhesive layer) is formed on the whole surface of a substrate, an ink containing an epoxy resin or the like which hardly suffers from roughening by a roughening solution as compared with the undercoat resin layer is coated on portions other than the circuit forming portions by means of printing, and the resulting substrate is immersed in a roughening solution in order to substantially roughen the exposed portions of the undercoat resin layer corresponding to the circuit forming portions. But the disadvantages of these processes are the use of a printing procedure and the use of a masking material to mask the portions other than the circuit forming portions.

Generally speaking, the printing procedure requires an additional elaborate step and an ink used therefor, which makes the production of printed wiring boards complicated and thus undesirable. Further, precision of the resulting pattern is not so good due to the nature of printing technique.

On the other hand, there is disclosed a process for forming printed wiring that does not use printing procedures and instead was ultraviolet light. This process comprises forming a photosensitive layer containing a substance which can function as catalyst after decomposed by light or a photosensitive substance including a catalyst therein on an insulating substrate, exposing circuit forming portions to ultraviolet light to decompose or sensitize the layer, selectively removing non-decomposed layer or nonsensitized layer at portions other than the circuit forming portions, and effecting electroless deposition (e.g. J. Electrochem. Soc. vol. 121, No. 1, pages 67-69 (1974)). Although this process requires no printing procedure, there are some technical problems in this process in that in the case of producing a printed circuit board having one or more through holes it is very difficult to coat the photosensitive layer uniformly in the through holes and to sensitize to the light, and the like.

The present inventors have studied to overcome these disadvantages mentioned above and to provide a simple process for forming printed wiring on an insulating substrate and found that if a photo-setting substance is present in the undercoat resin layer, the undercoat resin layer can be cured by exposing it to light and it cannot be roughened substantially even if it is immersed in a roughening solution. By applying such properties, it was found that when only portions which were not to be roughened, i.e. portions other than the circuit forming portions, were exposed to light, particularly actinic light, and then immersed in a roughening solution, portions to be roughened and portions not to be roughened were produced desirably on the same resin surface without using a printing procedure. In this manner the inventor accomplished the present invention.

SUMMARY OF THE INVENTION

It is an object of the present invention to provide a process for forming printed wiring on an insulating substrate simply without using a printing procedure to thereby overcome the problems of the conventional processes.

The present invention provides a process for forming printed wiring on an insulating substrate by using electroless deposition which comprise:

forming an adhesive layer containing a photo-setting substance on the substrate, exposing the adhesive layer to actinic light imagewisely so as to irradiate only portions other than those forming wiring, treating the surface of the substrate with a roughening solution so as to roughen the portions not exposed to actinic light, treating the surface of the substrate with a catalyst solution for activation for electroless deposition, contacting the surface of the substrate with a stripper for the catalyst, and conducting electroless deposition so as to form prescribed wiring on the substrate.

DETAILED DESCRIPTION OF THE INVENTION

According to the present invention, the adhesive layer (or an undercoat resin layer) is formed on the insulating substrate in order to bond the insulating substrate to electrelessly deposited metal film as usually used in the conventional processes for forming printed wiring by electroless deposition, said adhesive layer being characterized by containing a photo-setting substance which can produce crosslinking by vulcanization among double bonds or crosslinking of photosensitive groups by light, particularly by actinic light. The adhesive layer is exposed to actinic light imagewisely so that only the portions other than those forming wiring are irradiated and sufficiently cured. The treatment of the surface of the substrate with a roughening solution is practically carried out by immersing the substrate in the roughening solution to selectively roughen the portions which is to form wiring and which is not exposed to actinic light. The treatment of the surface of the substrate with the catalyst solution is practically carried out by immersing the substrate having the roughened portions and the non-roughened portions in the catalyst solution so as to activate the whole surface. The contact of the surface of the substrate with the stripper for the catalyst is practically carried out by immersing the substrate in the stripper containing at least one of an acid or an oxidizing agent or a mixture thereof. Since the amount of the catalyst attached to the roughened portion is larger than that attached to the non-roughened portions, the catalyst attached to the non-roughened portions is removed by the stripper, but that attached to the roughened portions remains therein. By the electroless deposition, metal can be deposited only on the roughened portions, that is, the portions forming wiring.

As the insulating substrate, there can be used those usually used for producing printed wiring boards such as paper-phenol resin laminates, paper-epoxy resin laminates, galss-epoxy resin laminates, glass-polyimide laminates, ceramics, and the like.

The adhesive layer can be formed on the substrate by using a conventional process, and if required, the adhesive layer can be cured with heating depending on the kind of resin used, e.g. at 140° C. for 1 hour.

The adhesive layer can be produced by using a composition comprising a thermosetting resin in an amount of preferably 30 to 70 parts by weight and a photo-setting substance in an amount of preferably 70 to 30 parts by weight, the total being 100 parts by weight. Compounding ratios of the composition can be varied depending on adhesive strength required. The compositions should be cured by exposing to actinic light and preferably should exhibit chemical resistance, particularly alkali resistance.

As the thermosetting resin, there can be used phenolic resins such as phenol-formaldehyde resins, alkylphenol resins, e.g. p-tert-butylphenol resin, epoxy resins, and the like alone or as a mixture thereof.

As the photo-setting substance, there can be used rubbers such as butadiene rubbers, acrylonitrile-butadiene rubbers, chloroprene rubbers, isoprene rubbers, styrene-butadiene rubbers, isobutylene-isoprene rubbers, natural rubber, and the like; terephthalate series resins, quinonediazide series resins, polyvinylcinnamate series resins, diazide series resins, epoxy-acrylate series resins, and silicone series resins, alone or as a mixture thereof. In the case of rubber, since the rubber has a large amount of double bonds in the molecule and can further be cured by promoting crosslinking by vulcanization by the action of ultraviolet light and the like, it can be used as the photo-setting substance. Therefore, ordinary curable resins containing rubber component therein can be used as the photo-setting substance.

The composition for producing the adhesive layer may further contain one or more conventional curing agents, vulcanizing agents, vulcanizing accelerators, fillers, pigments and the like additives.

The above-mentioned composition can be coated on the insulating substrate by a conventional method and cured to an extent so that the resulting adhesive layer can be roughened by the roughening solution in the later stage.

The adhesive layer is exposed to actinic light imagewisely so as to irradiate only portions other than those forming wiring.

As the actinic light, there can be used ultraviolet light, and similar rays such as green, blue and violet rays, X rays, and light containing mainly ultraviolet light. As the sources of these light, there can be used high-pressure or low-pressure mercury lamps, carbon arc lamps, xenon lamps, metal halide lamps, ultraviolet fluorescent lamps, incandescent lamps, etc., alone or in combination of two or more of them. These light sources can be selected depending on the kinds of the photo-setting substance and the thermosetting resin employed.

In order to irradiate only the portions other than those forming wiring, the non-roughened portions are irradiated by actinic light and the portions to be roughened are masked by a conventional method and the exposed protions are cured to an extent not to be roughened by a roughening solution substantially. As the masking method, there can be applied various conventional methods such as using a light transmissible glass plate wherein portions to be masked have previously been masked by using a conventional technique such as vacuum coating by evaporation and the like, using a film on which the desired wiring pattern has been formed as in the case of developing photographs, or the like. Such masking plates or films can directly be applied to the adhesive layer. Alternately projecting methods using such masking plates or films can also be applied to the adhesive layer.

The thus treated surface of the adhesive layer is treated with a roughening solution so as to roughen the portions not exposed to actinic light, more concretely, the substrate is immersed in the roughening solution.

The roughening solution contains mainly at least one of chromium trioxide, bichromic acid or bichromates such as their alkali salts, e.g. potassium bichromate, chromic acid and its salts such as alkali metal salts and permanganates such as their alkali metal salts; and, if required, it can further contain one or more of sulfuric acid, phosphoric acid, hydrofluoric acid, borofluoric acid and the like.

In the treatment of the surface of the adhesive layer with the roughening solution, only the non-exposed portions which is identical with the desired wiring pattern are roughened and the exposed portions are not substantially roughened due to the curing with irradiation by actinic light.

Subsequently, the resulting surface of the substrate is treated with a catalyst solution for activation for electroless deposition, more concretely, the substrate is immersed in the catalyst solution.

As the catalyst solution, a conventional one containing palladium and the like, e.g. $PdCl_2$—$SnCl_2$—HCl solution, can be used.

When the above treated substrate is subjected to electroless deposition immediately, metal is to be deposited on all the surface irrespective of roughened areas and non-roughened areas and the object cannot be attained. Therefore, it is necessary to contact the surface of the substrate with a stripper for the catalyst in order to remove the catalyst on the portions not roughened on the adhesive layer.

As the stripper for the catalyst, there can be used a conventional solution containing at least one inorganic acid and/or at least one oxidizing agent. As the inorganic acids, there can be used hydrochloric acid, nitric acid, sulfuric acid, phosphoric acid, and the like. As the oxidizing agents, there can be used chromium trichloride, bichromic acid and its salts, chromic acid and its salts, permanganates, chloric acid and its salts, perchloric acid and its salts, persulfuric acid and its salts, ferric compounds, cupric chloride, aqueous hydrogen peroxide, organic compounds such as p-toluenesulfonchloroamide salts, and the like.

By contacting the surface of the substrate with the stripper for the catalyst, more concretely, by immersing the substrate in the stripper solution, the catalyst for activation for electroless deposition on the non-roughened portions can be removed sufficiently.

The thus treated substrate is then subject to a conventional electroless deposition in order to form the desired pattern of wiring only on the non-exposed and roughened portions on the substrate. Almost all metals such as copper, nickel, gold, silver and the like can be deposited electrolessly.

According to this invention, since no printing technique is used for masking for, e.g. etching, but irradiation with actinic light is used, the procedure is simpler and easier than the printing method and the resulting wiring is more precise in pattern than that obtained by the conventional printing technique together with electroless deposition.

This invention is illustrated by way of the following examples in which all parts and percents are by weight unless otherwise specified.

EXAMPLE 1

On a paper-phenol resin laminated board (LP-43F, manufactured by Hitachi Chemical Co., Ltd.), the following resin composition (A) was coated by the knife coating method with a thickness of 30 μm to form an adhesive layer.

| Composition (A) | Parts |
|---|---|
| Acrylonitrile-butadiene rubber (Hycar 1072, manufactured by the Japanese Geon Co., Ltd.) | 100 |
| Phenol resin (PR - 11078, manufactured by Sumitomo Durez Co., Ltd.) | 66 |
| Hexamethylenetetramine | 6.6 |
| Zinc white | 5 |
| Methyl ethyl ketone | 550 |
| Methyl isobutyl ketone | 40 |

The thus treated substrate was heated at 140° C. for 1 hour so as to cure the resin composition. A silica glass plate wherein the portions corresponding to wiring had been masked by vacuum coating of chromium was directly placed on the resulting adhesive layer and irradiated by ultraviolet light from a metal halide lamp (3 kW) at a distance of about 10 cm from the upper part for 5 minutes. Subsequently, the substrate was immersed in a roughening solution having the following composion (B) at 45° C. for 10 minutes to roughen the surface.

| Composition (B) | |
|---|---|
| Chromic anhydride | 60 g |
| conc. H$_2$SO$_4$ | 220 ml |
| Water | Amount for making the total volume to 1 liter |

After washing with water at room temperature for 5 minutes, the substrate was immersed in aqueous NaOH with a concentration of 4 g/l at room temperature for 10 minutes. After washing with water at room temperature for 2 minutes, the substrate was immersed in 16% HCl at room temperature for 1 minute and then immersed in a catalyst solution comprising palladium chloride-stannous chloride-hydrochloric acid system (HS 101B, a sensitizer manufactured by Hitachi Chemical Co., Ltd.) at room temperature for 10 minutes. After washing with water at room temperature for 2 minutes, the substrate was immersed in a 3% hydrochloric acid aqueous solution containing 10 g of oxalic acid per liter at room temperature for 5 minutes. After washing with water at room temperature for 2 minutes, the substrate was immersed in a stripper having the following composition (C) to remove the catalyst on the non-roughened portions of the adhesive layer at room temperature for 10 minutes.

| Composition (C) | |
|---|---|
| FeCl$_3$ . 6H$_2$O | 0.1 g |
| HCl (37%) | 100 ml |
| Water | Amount for making the total volume to 1 liter |

After washing with water at room temperature for 2 minutes, the substrate was immersed in an electroless deposition solution having the following composition (D) at 72° C. for 2 hours to conduct electroless deposition.

| Composition (D) | |
|---|---|
| Cu$_2$SO$_4$ . 5H$_2$O | 10 g |
| Ethylenediamine tetraacetate | 30 g |
| Formalin (37%) | 3 ml |
| 2,2'-Dipyridyl | 30 ml |
| Polyethylene glycol (av. mol. wt. 6000) | 20 g |
| NaOH | Amount for making pH 12.8 (20° C.) |
| Water | Amount for making the total volume to 1 liter |

After the electroless deposition, the substrate was washed with water. By observing the substrate, it was found that no metal was deposited on the portions exposed to ultraviolet light. To the contrary, on the portions not exposed to ultraviolet light, uniform copper film of about 6 μm in thickness was formed.

EXAMPLE 2

The procedures of Example 1 were repeated for the electroless deposition except for using the following composition (E) in place of the composition (A).

| Composition (E) | Parts |
|---|---|
| Acrylonitrile-butadiene rubber (Hycar 1001, manufactured by the Japanese Geon Co. Ltd.) | 100 |
| Alkylphenol resin (H-2181S, manufactured by Hitachi Chemical Co., Ltd.) | 70 |
| Zirconium silicate | 10 |
| Sulfur | 2 |
| Zinc white | 5 |
| Methyl ethyl ketone | 500 |

The same results as obtained in Example 1 were obtained.

EXAMPLE 3

The procedures of Example 1 were repeated for the electroless deposition except for using the following composition (F) in place of the composition (A).

| Composition (F) | Parts |
|---|---|
| Acrylonitrile-butadiene rubber (Hycar 1032, manufactured by the | |

| Composition (F) | Parts |
| --- | --- |
| Japanese Geon Co., Ltd.) | 100 |
| Alkylphenol resin (H-2181S, manufactured by Hitachi Chemical Co., Ltd.) | 25 |
| Epoxy resin (Epikote 1001, manufactured by Shell Chemical Corp.) | 100 |
| Epoxy resin (Epikote 154, manufactured by Shell Chemical Corp.) | 35 |
| Calcium carbonate | 25 |
| Dicyandiamide | 4 |
| Methyl ethyl ketone | 500 |
| 2-Ethyl-4-methylimidazole | 0.3 |

The same results as obtained in Example 1 were obtained.

EXAMPLE 4

The procedures of Example 1 were repeated for the electroless deposition except for using the following Composition (G) in place of the composition (A).

| Composition (G) | Parts |
| --- | --- |
| Styrene-butadiene rubber (Nipol 1502, manufactured by the Japanese Geon Co., Ltd.) | 100 |
| Alkylphenol resin (H-2181S, manufactured by Hitachi Chemical Co., Ltd.) | 60 |
| Zirconium silicate | 10 |
| Sulfur | 2 |
| Zinc white | 5 |
| Methyl ethyl ketone | 500 |

The same results as obtained in Example 1 were obtained.

EXAMPLE 5

The procedures of Example 1 were repeated for the electroless deposition except for using the following composition (H) in place of the composition (A).

| Composition (H) | Parts |
| --- | --- |
| Butadiene rubber (Nipol BR1220, manufactured by the Japanese Geon Co., Ltd.) | 100 |
| Alkylphenol resin (H-2181S, manufactured by Hitachi Chemical Co., Ltd.) | 70 |
| Zirconium silicate | 10 |
| Sulfur | 2 |
| Zinc white | 5 |
| Methyl ethyl ketone | 500 |

The same results as obtained in Example 1 were obtained.

EXAMPLE 6

The procedures of Example 1 were repeated for the electroless deposition except for using the following composition (I) in place of the composition (A).

| Composition (I) | Parts |
| --- | --- |
| Isobutylene-isoprene rubber (Petero-Tex Butyl GSNS, manufactured by the Japanese Geon Co., Ltd.) | 100 |
| Alkylphenol resin (H-2181S, manufactured by Hitachi Chemical Co., Ltd.) | 70 |
| Zirconium silicate | 10 |
| Sulfur | 2 |
| Zinc white | 5 |
| Methyl ethyl ketone | 500 |

The same results as obtained in Example 1 were obtained.

EXAMPLE 7

The procedures of Example 1 were repeated for the electroless deposition except for using the following composition (J) in place of the composition (A).

| Composition (J) | Parts |
| --- | --- |
| Isoprene rubber (Nipol IR 2200, manufactured by the Japanese Geon Co., Ltd.) | 100 |
| Alkylphenol resin (H-2181S, manufactured by Hitachi Chemical Co., Ltd.) | 70 |
| Zirconium silicate | 10 |
| Sulfur | 2 |
| Zinc white | 5 |
| Methyl ethyl ketone | 500 |

The same results as obtained in Example 1 were obtained.

EXAMPLE 8

The procedures of Example 1 were repeated for the electroless deposition except for using the following composition (K) in place of the composition (A).

| Composition (K) | Parts |
| --- | --- |
| Polyvinylcinnamate series sensitized material (T.P.R., manufactured by Tokyo Ohka Kogyo Co., Ltd.) | 100 |
| Alkylphenol resin (H-2181S, manufactured by Hitachi Chemical Co., Ltd.) | 30 |
| Zirconium silicate | 5 |
| Hexamethylenetetramine | 5 |
| Methyl ethyl ketone | 300 |

The same results as obtained in Example 1 were obtained.

EXAMPLE 9

The procedures of Example 1 were repeated for the electroless deposition except for using the following composition (L) in place of the composition (A).

| Composition (L) | Parts |
| --- | --- |
| Acrylonitrile-butadiene rubber (Hycar 1552, manufactured by the Japanese Geon Co., Ltd.) | 100 |
| Polyvinylcinnamate series sensitized material (T.P.R., manufactured by Tokyo Ohka Kogyo Co., Ltd.) | 30 |
| Alkylphenol resin (H-2181S, manufactured by Hitachi Chemical Co., Ltd.) | 70 |
| Zirconium silicate | 12 |
| Sulfur | 2 |
| Zinc white | 5 |
| Methyl ethyl ketone | 500 |

The same results as obtained in Example 1 were obtained.

EXAMPLE 10

The procedures of Example 1 were repeated for the electroless deposition except for using the composition (F) used in Example 3 in place of the composition (A) used in Example 1 and the following composition (M) in place of the composition (B) used in Example 1.

| Composition (M) | |
|---|---|
| Sodium bichromate | 20 g |
| Borofluoric acid (42%) | 500 ml |
| Water | Amount for making the total volume to 1 liter. |

The same results as obtained in Example 1 were obtained.

EXAMPLE 11

The procedures of Example 1 were repeated for the electroless deposition except for using the following composition (N) in place of the composition (B).

| Composition (N) | |
|---|---|
| Bichromic acid | 100 g |
| Phosphoric acid (85%) | 200 ml |
| Water | Amount for making the total volume to 1 liter. |

The same results as obtained in Example 1 were obtained.

EXAMPLE 12

The procedures of Example 1 were repeated for the electroless deposition except for using the following composition (O) in place of the composition (C).

| Composition (O) (Immersion at room temperature for 8 minutes) | | |
|---|---|---|
| Cupric chloride . dihydrate | ($CuCl_2 . 2H_2O$) | 30 g |
| Hydrochloric acid (37%) | | 20 ml |
| Water | | Amount for making the total volume to 1 liter. |

The same results as obtained in Example 1 were obtained.

EXAMPLE 13

The procedures of Example 1 were repeated for the electroless deposition except for using the following composition (P) in place of the composition (C).

| Composition (P) (Immersion at room temperature for 30 minutes.) | |
|---|---|
| Hydrochloric acid (37%) | 500 ml |
| Water | Amount for making the total volume to 1 liter |

The same results as obtained in Example 1 were obtained.

EXAMPLE 14

The procedures of Example 1 were repeated for the electroless deposition except for using the following composition (Q) in place of the composition (C).

| Composition (Q) (Immersion at room temperature for 10 minutes.) | |
|---|---|
| Ammonium persulfate | 3 g |
| conc. Sulfuric acid | 10 ml |
| Water | Amount for making the total volume to 1 liter. |

The same results as obtained in Example 1 were obtained.

EXAMPLE 15

The procedures of Example 1 were repeated for the electroless deposition except for using the following composition (R) in place of the composition (C).

| Composition (R) (Immersion at 40° C. for 2 minutes.) | |
|---|---|
| Sodium bichromate | 20 g |
| Borofluoric acid (42%) | 1000 ml |

The same results as obtained in Example 1 were obtained.

EXAMPLE 16

The procedures of Example 1 were repeated for the electroless deposition except for using the following composition (S) in place of the composition (D).

| Composition (S) | |
|---|---|
| Nickelous chloride . hexahydrate ($NiCl_2 . 6H_2O$) | 35 g |
| Acetic acid | 15 g |
| Sodium hypophosphite | 20 g |
| Sodium hydroxide | Amount for making pH 5.0 |
| Water | Amount for making the total volume to 1 liter. |

The same results as obtained in Example 1 except for replacing copper by nickel were obtained.

COMPARATIVE EXAMPLE 1

The procedures of Example 1 were repeated for the electroless deposition except for not irradiating the surface of the adhesive layer with ultraviolet light. As a result, deposited copper film covered whole surface of the adhesive layer.

COMPARATIVE EXAMPLE 2

The procedures of Example 1 were repeated for the electroless deposition except for omitting the treatment with the composition (C). As a result, deposited copper film covered whole surface of the adhesive layer.

As mentioned above, according to the present invention, printed wiring boards having high precision in wiring which cannot be attained by a conventional printing technique can be produced easily and simply.

What is claimed is:

1. A process for forming printed wiring on an insulating substrate by using electroless deposition which comprises
    forming an adhesive layer containing a photo-setting substance on the substrate,
    exposing the adhesive layer to actinic light imagewisely so as to irradiate only portions other than those forming wiring, treating the surface of the substrate with a roughening solution so as to roughen the portions not exposed to actinic light, treating the surface of the substrate with a catalyst solution for activation for electroless deposition, contacting the surface of the substrate with a stripper for the catalyst, and conducting electroless deposition so as to form prescribed wiring on the substrate.

2. A process according to claim 1, wherein the adhesive layer is produced by using a composition comprising a thermosetting resin and a photo-setting substance.

3. A process according to claim 2, wherein the thermosetting resin is a phenol-formaldehyde resin, alkyl-phenol-formaldehyde resin, epoxy resin or a mixture thereof.

4. A process according to claim 2, wherein the photo-setting substance is polyvinylcinnamate resin, terephthalate resin, quinonediazide resin, diazide resin, epoxy-acrylate resin, silicone resin, or a mixture thereof.

5. A process according to claim 2, wherein the photo-setting substance is a butadiene rubber, acrylonnitrile-butadiene rubber, chloroprene rubber, isoprene rubber, styrene-butadiene rubber, isobutylene-isoprene rubber, natural rubber or a mixture thereof.

6. A process according to claim 1, wherein the actinic light is obtained from a high-pressure mercury lamp, a low-pressure mercury lamp, a carbon arc lamp, a xenon lamp, a metal halide lamp, an ultraviolet fluorescent lamp, an incandescent lamp, or a combination of two or more of them.

7. A process according to claim 1, wherein the stripper for the catalyst contains at least one inorganic acid and/or at least one oxidizing agent.

8. A process for producing a printed wiring board which comprises forming an adhesive layer containing a photo-setting substance on an insulating substrate, exposing the adhesive layer to actinic light imagewisely so as to irradiate only portions other than those forming wiring, immersing the substrate in a roughening solution so as to roughen portions not exposed to actinic light, immersing the substrate in a catalyst solution for activation for electroless deposition, immersing the substrate in a stripper for the catalyst so as to remove the catalyst from the portions exposed to actinic light, and conducting electroless deposition so as to form prescribed wiring on the substrate.

* * * * *